United States Patent
Son et al.

(10) Patent No.: US 7,553,742 B2
(45) Date of Patent: Jun. 30, 2009

(54) METHOD(S) OF FORMING A THIN LAYER

(75) Inventors: Yong-Hoon Son, Yongin-si (KR); Yu-Gyun Shin, Seongnam-si (KR); Jong-Wook Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 432 days.

(21) Appl. No.: 11/329,158

(22) Filed: Jan. 11, 2006

(65) Prior Publication Data
US 2006/0154453 A1 Jul. 13, 2006

(30) Foreign Application Priority Data
Jan. 13, 2005 (KR) .............. 10-2005-0003084

(51) Int. Cl.
*H01L 21/76* (2006.01)
(52) U.S. Cl. .............. 438/429; 438/481; 438/503; 438/507
(58) Field of Classification Search .............. 438/429, 438/481, 503, 507, 509, 637, 638; 257/E21.09, 257/E33.005, E21.092, E21.133, E21.461, 257/E21.562, E21.579
See application file for complete search history.

(56) References Cited
U.S. PATENT DOCUMENTS

| | | | |
|---|---|---|---|
| 5,073,516 A * | 12/1991 | Moslehi ................ 438/429 |
| 5,494,823 A | 2/1996 | Takemoto et al. |
| 5,495,823 A * | 3/1996 | Kobayashi ................ 117/8 |
| 5,963,789 A * | 10/1999 | Tsuchiaki ................ 438/62 |
| 6,172,381 B1 | 1/2001 | Gardner et al. |
| 6,429,484 B1 | 8/2002 | Yu |
| 7,049,230 B2 * | 5/2006 | Park ........................ 438/672 |
| 2004/0033674 A1 * | 2/2004 | Todd ....................... 438/478 |
| 2005/0040463 A1 * | 2/2005 | Wang ....................... 257/345 |
| 2005/0112870 A1 * | 5/2005 | Park ........................ 438/647 |

FOREIGN PATENT DOCUMENTS

| KR | 10-1995-0034402 | 10/1995 |
|---|---|---|
| KR | 10-2004-0006678 | 2/2004 |
| KR | 10-2004-7011836 | 7/2004 |

* cited by examiner

*Primary Examiner*—Michelle Estrada
(74) *Attorney, Agent, or Firm*—Harness, Dickey & Pierce, P.L.C.

(57) ABSTRACT

A method of forming a thin layer including providing a first single-crystalline silicon layer partially exposed through an opening in an insulation pattern and forming an epitaxial layer on the first single-crystalline silicon layer and forming an amorphous silicon layer on the insulation pattern, the amorphous silicon layer having a first portion adjacent the epitaxial layer and a second portion spaced apart from the first portion, wherein the amorphous silicon layer is formed on the insulation pattern at substantially the same rate at the first portion and at a second portion. The amorphous silicon layer may be formed to a uniform thickness without a thinning defect.

22 Claims, 9 Drawing Sheets

METHOD(S) OF FORMING A THIN LAYER

PRIORITY CLAIM

This application claims priority under 35 U.S.C. § 119 of Korean Patent Application No. 2005-3084, filed on Jan. 13, 2005, in the Korean Intellectual Property Office (KIPO), the entire contents of which are incorporated herein by reference.

BACKGROUND OF THE INVENTION

1. Field of the Invention

Example embodiments of the present invention relate to a method of forming a thin layer, and more particularly relate, for example, to a method of forming a thin layer having a single-crystal structure.

2. Description of the Related Art

Solid materials may be classified into three categories, for example, single-crystal material, poly-crystalline material and amorphous material depending upon the structure thereof. The single-crystal material may have a regular unit crystal structure, e.g., an arrangement which may be regular. In contrast, the poly-crystalline material may have a plurality of unit crystal structures, each of which may have an irregular and/or random arrangement. The amorphous material may have no crystal structure, and the atoms may be irregularly arranged therein.

The poly-crystalline material may contain many grain boundaries due to the various (e.g., many) unit crystal structures thereof, each of which may be aligned in different directions. Such alignment in the various different directions may hinder carriers such as electrons and holes from moving and/or being controlled in the poly-crystalline material. This may lead to a deterioration of electronic characteristics of the poly-crystalline material. In contrast, the single-crystal material may have almost no grain boundaries due to the single-crystalline structure. Accordingly, the carriers may move relatively freely and may be more readily controlled in the single-crystal material than in the poly-crystalline material. As a result, the electronic characteristics of the single-crystal material should be superior to those of the poly-crystalline material.

For the above reason, a stacked structure such as a thin-film transistor (TFT) or a multilayer structure such as a system-on-chip (SOC) device may include at least one structure comprising a single-crystal material as a channel layer thereof. An example of a single-crystal material may include a single-crystalline silicon layer.

An amorphous silicon layer may be formed on a single-crystalline silicon layer. An epitaxial process may be conducted on the amorphous silicon layer using the underlying single-crystal structure in the silicon layer as a seed. Accordingly, the structure of the amorphous silicon layer may be transformed into a single-crystal structure, thereby forming and/or growing the single-crystalline silicon layer.

A native oxide layer may often form on a surface of a single-crystalline silicon thin layer. The native oxide layer may cause some problems in forming an amorphous silicon layer on a single-crystalline silicon thin layer. For example, when an epitaxial process is conducted on an amorphous silicon layer formed on a single-crystalline silicon thin layer having a native oxide layer, nucleation may be randomly generated on a surface of the amorphous silicon layer. This may be because the native oxide layer may prevent (or interfere with) the single-crystalline silicon in the single-crystalline silicon thin layer from being used as the seed in the epitaxial process. Accordingly, the amorphous silicon layer may be transformed into a poly-crystalline silicon layer rather than a single-crystalline silicon layer during or as a result of the epitaxial process conducted.

In view of the above, the formation of the native oxide layer has been an obstacle in transforming the amorphous silicon layer into the single-crystalline silicon layer.

Thus, various methods have been suggested for removing and/or preventing the formation of the native oxide layer on the single-crystalline silicon thin layer so as to more readily permit transformation of an amorphous silicon layer into a single-crystalline silicon layer. For example, under high vacuum conditions in a processing chamber (for forming the amorphous silicon layer), a residual amount of vapor ($H_2O$) and oxygen ($O_2$) gas may be reduced sufficiently to prevent the formation of the native oxide layer. Further, ion beams may be applied onto a surface of the amorphous silicon layer, so that the native oxide layer may be removed. However, these methods require additional devices for evacuating the processing chamber and for projecting ion beams.

According to conventional art, an insulation pattern may be formed on a single-crystalline silicon thin layer in which a single-crystalline silicon may be used as a seed in the epitaxial process, and the single-crystalline silicon thin layer may be partially exposed to the epitaxial gases. For example, a silicon source gas may be supplied onto the single-crystalline silicon thin layer (including the insulation pattern), to prevent the native oxide layer from forming on the single-crystalline silicon thin layer. Accordingly, an epitaxial layer may be formed on the single-crystalline silicon thin layer, and an amorphous silicon layer (without the native oxide layer) may be formed on the insulation pattern.

However, a thinning defect may be created at a boundary portion between the insulation pattern and the single-crystalline silicon thin layer, as shown in FIG. 1. FIG. 1 depicts a thinning defect at the boundary portion between the insulation pattern and the single-crystalline silicon thin layer.

Referring to FIG. 1, the thickness of the amorphous silicon layer is thinner at the boundary portion I between the insulation pattern and the single-crystalline silicon thin layer because the chemical bond energy is greater between the silicon source gas and the single-crystalline silicon thin layer versus that between the silicon source gas and the insulation pattern. Most of the silicon source gases supplied to the boundary portion I react with the insulation pattern rather than with the single-crystalline silicon thin layer due to the higher bond energy associated with the single-crystalline silicon thin layer.

When a subsequent process such as a chemical mechanical polishing (CMP) process or an etching process is conducted on the amorphous silicon layer subject to the thinning defect, the amorphous silicon layer may be more readily (and possibly frequently) broken at the boundary portion I due to the thinning defect.

SUMMARY

Example embodiments of the present invention provide a method of forming a thin layer without (or substantially without) a thinning defect.

Example embodiments of the present invention provide a method of forming a thin layer without (or substantially without) a thinning defect at a boundary portion of an amorphous silicon layer between an insulation pattern and a single-crystalline silicon thin layer.

According to an example embodiment of the present invention, there is provided a method of forming a thin layer. For example, an insulation pattern may be formed on an object having a first single-crystalline silicon layer, and the first single-crystalline silicon layer may be exposed (e.g., to source gases as described herein) through the insulation pattern. As an example, the first single-crystalline silicon layer may make contact with the insulation pattern at a first portion of the insulation pattern, and at a second portion, which is spaced apart from the first portion by a distance (e.g., horizontally and/or laterally oriented) on the insulation pattern. Pursuant to an example embodiment of the present invention, an epitaxial layer and an amorphous silicon layer may be formed on the first single-crystalline silicon layer and on the insulation pattern, respectively, by supplying a source gas, for example, silicon gas, under condition(s) (e.g., temperature, pressure and/or flow rate along with optional carrier gas(es)) at which the amorphous silicon layer may be formed on the insulation pattern at about the same rate both at the first portion and at the second portion of the insulation pattern. The amorphous silicon layer may be formed to a uniform thickness without (or substantially without) a thinning defect.

According to another example embodiment of the present invention, there is provided another method of forming a thin layer. For example, a first insulation pattern having an opening through which a surface of the first single-crystalline silicon layer may be partially exposed may be formed on the first single-crystalline silicon layer. According to an example embodiment of the present invention, a first seed layer may be formed on the exposed surface of the first single-crystalline silicon layer through the opening. The first seed layer, for example, may comprise single-crystalline silicon. Pursuant to an example embodiment of the present invention, an epitaxial layer and an amorphous silicon layer may be formed on the first seed layer and on the insulation pattern, respectively, by supplying a silicon source gas under condition(s) (e.g., temperature, pressure and/or flow rate along with optional carrier gas(es)) at which the amorphous silicon layer may be formed on the first insulation pattern at substantially the same rate both at a first portion (e.g., around an entrance portion of the opening) and at a second portion (e.g., at a predetermined horizontally oriented distance from the first portion) of the insulation pattern. The first seed layer may make contact with the first insulation pattern at the first portion of the insulation pattern. Pursuant to another example embodiment of the present invention, a second single-crystalline silicon layer may be formed on the epitaxial layer and the amorphous silicon layer may be transformed into a single-crystal structure.

According to example embodiments of the present invention, formation of an epitaxial layer and an amorphous silicon layer under a controlled temperature may sufficiently reduce the thinning defect at a boundary portion between the single-crystalline silicon layer and the insulation pattern. Pursuant to an example embodiment of the present invention, the single-crystalline silicon layer may be formed by transforming the amorphous silicon layer into a single-crystal structure. Thus, for example, when a stacked structure based on the so made single-crystalline silicon layer may be used as a channel layer, a semiconductor device including the stacked structure may have improved electronic characteristics.

BRIEF DESCRIPTION OF THE DRAWINGS

Example embodiments of the present invention will be more clearly understood from the detailed description taken in conjunction with the accompanying drawings.

DESCRIPTION OF EXAMPLE EMBODIMENTS OF THE INVENTION

Figure 1:
FIG. 1 depicts a thinning defect at the boundary portion of a conventional amorphous silicon layer between the insulation pattern and the single-crystalline silicon thin layer.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

FIGS. 2A to 2E are cross sectional views illustrating intermediates and/or final structures of a method of forming a thin layer according to an example embodiment of the present invention.

Figure 2A:
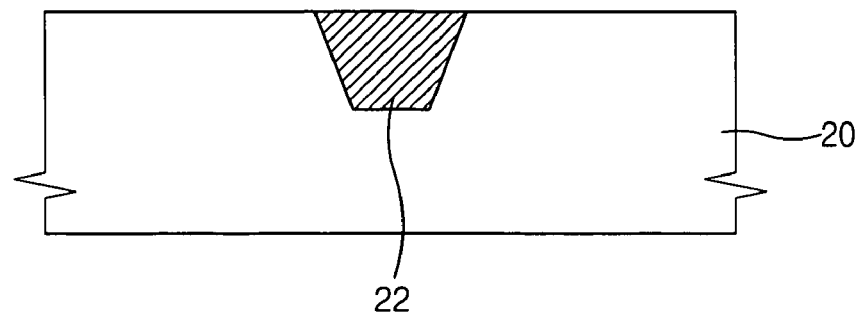
FIGS. 2A to 2E are cross sectional views illustrating intermediates and/or final structures of a method of forming a thin layer according to an example embodiment of the present invention.

Referring to the example embodiment of FIG. 2A of the present invention, an insulation pattern 20 may be formed on a substrate, and a first single-crystalline silicon layer 22 may be partially exposed through the insulation pattern 20.

The insulation pattern 20, for example, may comprise an oxide, e.g., an oxide pattern. Non-limiting examples of the first single-crystalline silicon layer 22 include a silicon substrate, a silicon-on-insulator (SOI) substrate and an epitaxial layer formed by a selective epitaxial growth (SEG) process using single-crystalline silicon as a seed. In particular, according to an example embodiment of the present invention, when the first single-crystalline silicon layer 22 is an epitaxial layer, a silicon substrate or an SOI substrate may be used as a base substrate.

According to an example embodiment of the present invention, a planarization process may be further conducted on the insulation pattern 20 and the first single-crystalline silicon layer. Pursuant to an example embodiment of the present embodiment, the planarization process may be a CMP process.

Further, according to an example embodiment of the present invention, a surface treatment process may be conducted on the insulation pattern 20 and the first single-crystalline silicon layer 22 using an aqueous hydrogen fluoride (HF) solution. Accordingly, a native oxide layer may be removed from a surface of the insulation pattern 20, and a hydrogen passivation layer may be formed on the surface.

Figure 2B:
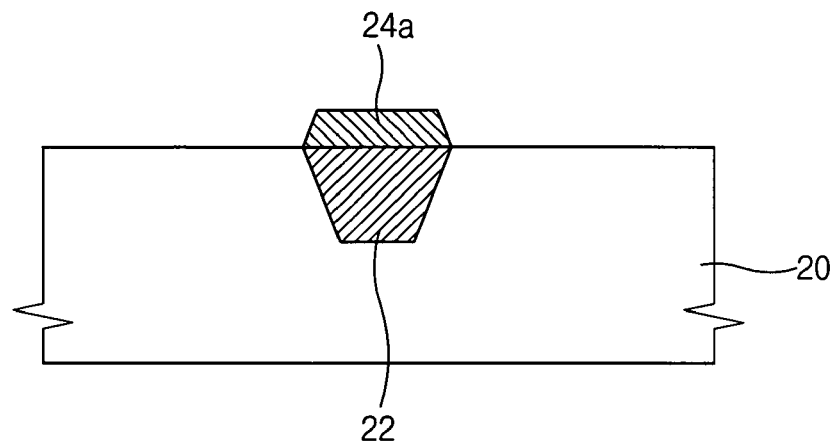
Figure 2C:
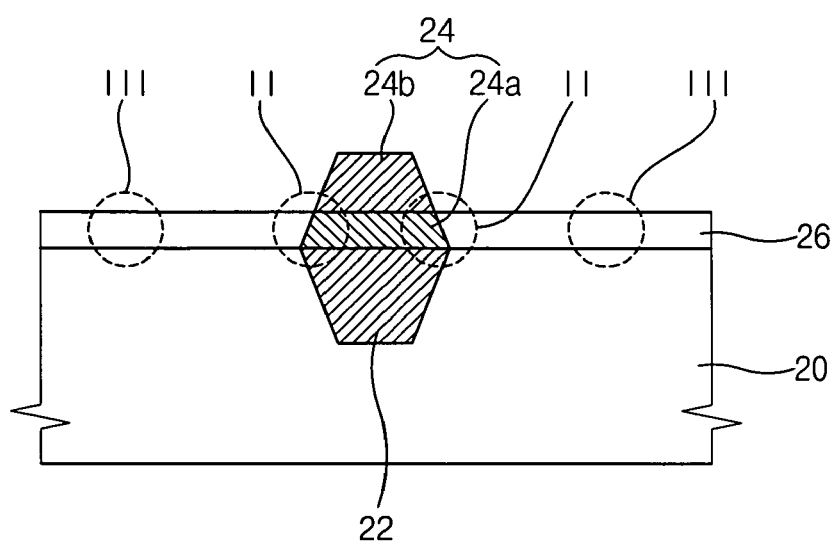

Referring to the example embodiments of FIGS. 2B and 2C of the present invention, a silicon source gas may be supplied onto the insulation pattern 20 and the first single-crystalline layer 22. Examples of the silicon source gas include, but are not limited to, a $Si_xH_y$ (wherein, x and y are positive numbers) gas, a $Si_xH_yCl_z$ (wherein, x, y and z are positive numbers) and a $Si_xCl_y$ gas (wherein, x and y are positive numbers). The above silicon source gases may be used alone or in combinations thereof according to an example embodiment of the present invention. In accordance with another example embodiment of the present invention, a silane ($SiH_4$) gas may be used as the silicon source gas.

Accordingly, pursuant to an example embodiment of the present invention, an epitaxial layer 24 may be grown on the first single-crystalline silicon layer 22 without (or substantially without) forming a native oxide layer on the first single-crystalline silicon layer 22, together with forming an amorphous silicon layer 26 on the insulation layer 20.

Referring to the example embodiment of FIG. 2C of the present invention, when the epitaxial layer 24 is grown and the amorphous silicon layer 26 is formed on the insulation pattern 20, the thickness of the amorphous silicon layer 26 may be smaller at a first portion II at which the first single-crystalline silicon layer 22 makes contact with the insulation pattern 20 than at a second portion III (outwardly spaced apart from the first portion II).

In accordance with an example embodiment of the present invention, the processing temperature may be controlled in such a way that the amorphous silicon layer 26 may be formed at the same rate both at the first portion II and at the second portion III. Pursuant to an example embodiment of the present invention, the amorphous silicon layer 26 may be formed at a temperature in a range from about 380° C. to about 510° C. In particular, according to another example embodiment of the present invention, the amorphous silicon layer 26 may be formed at a temperature in a range from about 400° C. to about 500° C., or in a range from about 430° C. to about 490° C. In accordance with other example embodiments of the present invention, the amorphous silicon layer 26 may be formed at a temperature in a range from about 460° C. to about 490° C. (e.g, 465-485° C.; 470-485° C.; 475-485° C.; 480-485° C.).

Pursuant to an example embodiment of the present invention, the silicon source gas may be supplied at a pressure in a range from about 0.2 torr to about 0.6 torr at any of the above-noted temperature ranges. For example, the pressure may be in a range from about 0.3 torr to about 0.5 torr, or the pressure (of the silicon source gas supplied) may be about 0.4 torr.

Further, according to yet another example embodiment of the present invention, a nitrogen gas may be supplied to a processing chamber as a carrier gas simultaneously with the silicon source gas. The nitrogen gas may prevent silicon atoms from dissociating from the silicon source gas and from being diffused on a surface of the first single-crystalline silicon layer 22.

Pursuant to another example embodiment of the present invention, the silicon source gas may be supplied at a flow rate from about 20 sccm (standard cubic centimeters per minute) to about 200 sccm, and the nitrogen gas may be supplied at a flow rate from about 0.01 sccm to about 200 sccm in view of a size of the processing chamber. If a larger or smaller chamber is used, the flow rate(s) may be adjusted as needed to obtain the desired thicknesses of the various layers discussed herein. In accordance with another example embodiment of the present invention, the silicon source gas may be supplied at a flow rate of about 100 sccm, and the nitrogen gas may be supplied at a flow rate from about 0.01 sccm to about 100 sccm.

Pursuant to another example embodiment of the present invention, a detailed description of a process of forming the epitaxial layer 24 on the first single-crystalline silicon layer 22 and a process of forming the amorphous silicon layer 26 on the insulation layer 20 is provided below.

Referring to the example embodiment of FIG. 2B of the present invention, a silicon source gas may be supplied onto an object including the insulation layer 20 at a first flow rate. A nitrogen gas also may be supplied simultaneously with the silicon source gas. In accordance with an example embodiment of the present invention, while the silicon source gas is supplied onto the object, the temperature of the object may be increased to a range from about 380° C. to about 410° C., or to a range from about 480° C. to about 510° C., and the pressure of the gas (silicon source gas and any carrier gas e.g., nitrogen gas) may be maintained in a range from about 0.2 torr to about 0.6 torr.

As a result, according to an example embodiment of the present invention, the formation of a native oxide layer on the first single-crystalline silicon layer 22 is sufficiently prevented (or reduced or minimized), and a first epitaxial layer 24a may be formed on the first single-crystalline silicon layer 22 without (or substantially without) the native oxide layer. In an example embodiment of the present invention, vapor ($H_2O$) and/or oxygen gas ($O_2$) around the first single-crystalline silicon layer 22 is prevented from reacting (or the reaction is sufficiently reduced or minimized) with the first single-crystalline silicon layer 22 because of the pressure of silicon source gas. That is, the first single-crystalline silicon layer 22 may be reacted with the silicon source gas rather than with the vapor ($H_2O$) or the oxygen gas ($O_2$) around the first single-crystalline silicon layer 22, thereby, creating a silicon-silicon (Si—Si) bond.

Accordingly, pursuant to an example embodiment of the present invention, the first epitaxial layer 24a may be formed on the first single-crystalline silicon layer 22 using single-crystalline silicon of the first single-crystalline silicon layer 22 as a seed for a selective epitaxial growth (SEG) process, so that the first epitaxial layer 24a comprises single-crystalline silicon.

Referring to the example embodiment of FIG. 2C of the present invention, the silicon source gas may be supplied with a second flow rate in a temperature range from about 480° C. to about 510° C. The second flow rate may be from about two to about four times as much as the first flow rate. In an example embodiment of the present invention, the silicon source gas may be supplied at a second flow rate at a temperature of about 485° C. and at a pressure in a range from about 0.2 torr to about 0.6 torr.

Accordingly, pursuant to an example embodiment of the present invention (wherein the second flow rate is about 2-4 times the first flow rate), a second epitaxial layer 24b may be formed on the first epitaxial layer 24a, and the amorphous silicon layer 26 may be formed on the insulation pattern 20. In particular, the amorphous silicon layer 26 may be formed at the same rate both at the first portion II and at the second portion III because the bond energy between the silicon source gas and the first epitaxial layer 24a is substantially identical to the bond energy between the silicon source gas and the insulation pattern 20 at the above-noted temperature range from about 480° C. to about 510° C.

Accordingly, pursuant to an example embodiment of the present invention, the first epitaxial layer 24a does not interfere with the silicon source gas from reacting with the insulation pattern 20 at the first portion II under the condition of the above-noted temperature range and/or the above-noted second flow rate. Thus, the amorphous silicon layer 26 may be formed on the insulation pattern 20, substantially only when the second epitaxial layer 24b is formed because a chemical reaction between the silicon source gas and the insulation pattern 20 requires a sufficient reaction time, and because the silicon source gas is supplied more abundantly (e.g., at a second flow rate which may be from about 2 to 4 times the first flow rate) when the second epitaxial layer 24b may be formed rather than when the first epitaxial layer 24a may be formed.

Accordingly, pursuant to an example embodiment of the present invention, the silicon source gas may be supplied onto the object including the insulation pattern 20 under the above-noted temperature, flow rate and/or pressure conditions, so that the epitaxial layer 24 (including the first epitaxial layer 24a and the second epitaxial layer 24b) may be formed on the first single-crystalline silicon layer 22 without (or substantially without) the native oxide layer, and the amorphous silicon layer 26 may be formed to a substantially uniform thickness across both the first portion II and the second portion III as depicted in FIG. 2C.

According to an example embodiment of the present invention, after the epitaxial layer 24 is grown on the first single-crystalline silicon layer 22 and the amorphous silicon layer 26 is formed on the insulation pattern 20, the temperature of the processing chamber may be decreased to a range from about 380° C. to about 410° C. Pursuant to an example embodiment of the present invention, a nitrogen gas (or other suitable gas) may be further supplied (e.g., as a purge gas) onto the object including the epitaxial layer 24 (e.g., a combination of layers 24a and 24b as depicted in FIG. 2C) and the amorphous silicon layer 26, prior to the temperature decrease.

Figure 2D:
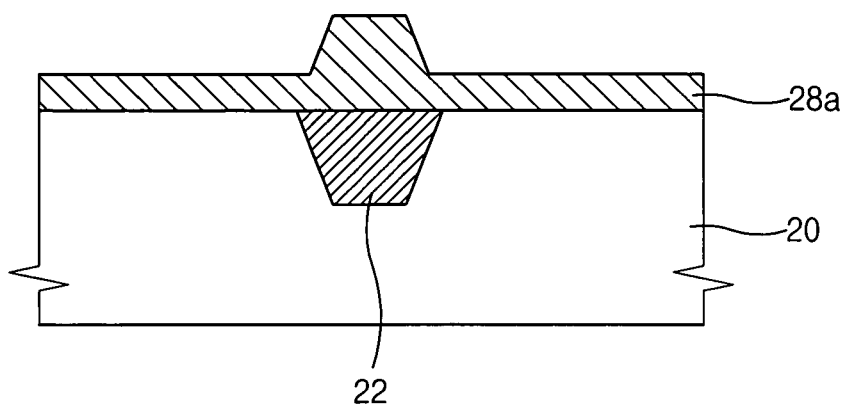

Referring to the example embodiment of FIG. 2D of the present invention, the amorphous silicon layer 26 may be transformed into a single-crystalline layer, so that a preliminary second single-crystalline silicon layer 28a may be formed (on the object including the insulation pattern 20) from the original epitaxial layer 24 and the amorphous layer 26.

In accordance with an example embodiment of the present invention, a solid epitaxial process followed by a heat treatment may be conducted on the amorphous silicon layer 26 to transform the amorphous silicon layer 26 into a single-crystalline structure, by using the epitaxial layer 24 on the first single-crystalline silicon layer 22 as a seed in the solid epitaxial process.

In accordance with an example embodiment of the present invention, the heat treatment of the solid epitaxial process should be conducted at a temperature in a range from about 570° C. to about 650° C. In particular, the heat treatment may be conducted at a temperature in a range from about 580° C. to about 620° C., or conducted at a temperature of about 600° C. according to example embodiments of the present invention. Also, for example, the heat treatment may be conducted in a furnace or other suitable heating device.

Alternatively, the solid epitaxial process may be conducted without any (or without substantially any) temperature decrease as described with reference to the example embodiment of FIG. 2C of the present invention. Rather, the temperature at which the second epitaxial layer 24b may be formed may be increased to a range from about 570° C. to about 650° C., and, thus, the solid epitaxial process may be continuously conducted on the amorphous silicon layer 26 to transform layer 26 into layer 28a as depicted in FIG. 2D.

As depicted in the example embodiment of FIG. 2D of the present invention, a portion of the preliminary second single-crystalline silicon layer 28a may be somewhat protruded (corresponding to the first single-crystalline silicon layer 24 of the example embodiment of FIG. 2C), so that a semiconductor structure such as a gate pattern may not be readily amenable to being uniformly stacked on the preliminary second single-crystalline silicon layer 28a. For this reason, the preliminary second single-crystalline silicon layer 28a may be planarized to have a flat top surface (or relatively or substantially flat). Referring to the example embodiment of FIG. 2E of the present invention, the preliminary second single-crystalline silicon layer 28a may be planarized by a chemical mechanical polishing (CMP) process, thereby forming a second single-crystalline silicon layer 28, the top surface of which may be substantially flat.

Figure 2E:
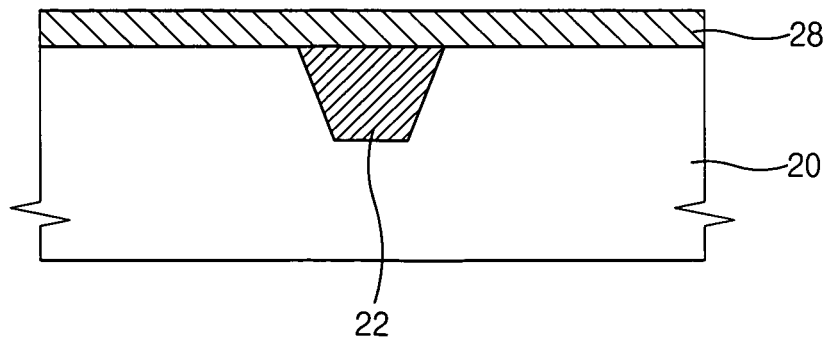

Referring to the example embodiment of FIG. 2E of the present invention, the preliminary second single-crystalline silicon layer 28a may be transformed from the amorphous silicon layer 26 having a substantially uniform thickness across both the first portion II and the second portion III. Thus, the second single-crystalline silicon layer 28 may have no cut-off portion despite conducting a CMP process on the preliminary second single-crystalline silicon layer 28a. In other words, because layer 28a may not suffer from having a thinning defect at portion II (e.g., the thickness of layer 28a is substantially uniform across its width including portions II and III as depicted in FIGS. 2D and 2E), layer 28 may be continuous across its width with no breaks or cut-offs as depicted in FIG. 2E.

According to example embodiments of the present invention, the second single-crystalline silicon layer 28 may have a flat (or relatively or substantially flat) top surface, so that a stacked structure for forming a semiconductor device may be provided on the second single-crystalline silicon layer 28 having improved electric characteristics. For example, the second single-crystalline silicon layer 28 may be used as a channel layer for a semiconductor device.

Referring to the example embodiments of FIGS. 3A to 3F of the present invention, these figures illustrate cross sectional views of various intermediate and/or final structures of a method of forming a thin layer.

Figure 3A:
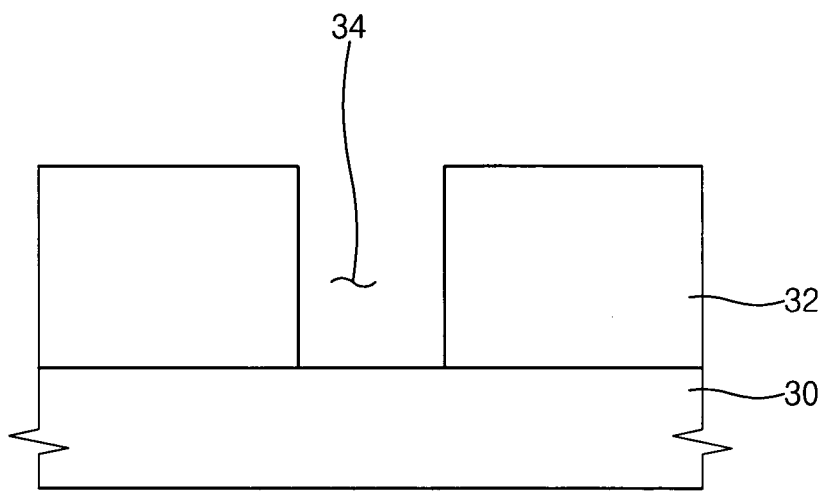
FIGS. 3A to 3F are cross sectional views illustrating intermediates and/or final structures of a method of forming a thin layer according to an example embodiment of the present invention.

Referring to the example embodiment of FIG. 3A of the present invention, an insulation layer (not shown) may be formed on a first single-crystalline silicon layer 30 and is patterned to thereby form an insulation pattern 32 having an opening 34 through which a top surface of the first single-crystalline silicon layer 30 is partially exposed.

Examples of the first single-crystalline silicon layer 30 may include (but are not limited to) a silicon substrate, a silicon-on-insulator (SOI) substrate and an epitaxial layer formed by a selective epitaxial growth (SEG) process using single-crystalline silicon as a seed, as described above. The insulation pattern 32 may comprise an oxide layer pattern.

In accordance with an example embodiment of the present invention, a silicon substrate may be used as the first single-crystalline silicon layer 30, and a semiconductor structure such as a gate electrode, metal wiring or a logic device may be formed on the silicon substrate. Additionally, another structure for a semiconductor device also may be formed on the substrate depending on the desired device design.

Figure 3B:
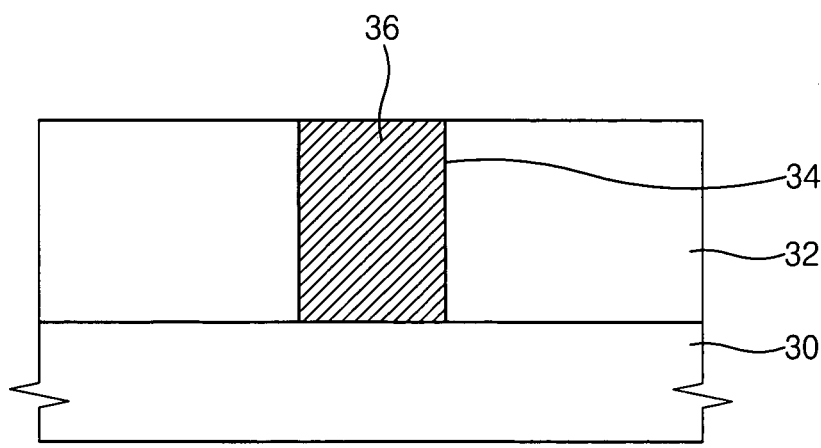

Referring to the example embodiment of FIG. 3B of the present invention, an SEG process may be conducted at a temperature in a range from about 700° C. to about 900° C., and a seed layer comprising a single-crystalline silicon, (which may be the same crystal structure as the first single-crystalline silicon layer 30), may be grown from the exposed surface of the first single-crystalline silicon layer 30 through the opening 34 to a sufficient thickness to fill up the opening 34.

Figure 4:
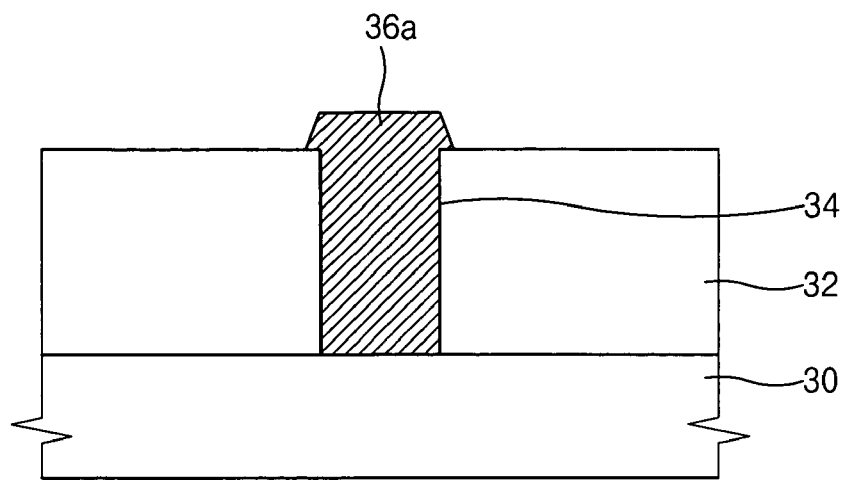
FIG. 4 is a cross sectional view illustrating the seed layer (shown in FIG. 3B) having a thickness which is greater than that of the first insulation pattern according to an example embodiment of the present invention.

In particular, referring to the example embodiment depicted in FIG. 4 of the present invention, when the seed layer 36 may be grown to a thickness greater than the thickness of the insulation pattern 32, the seed layer 36 may be planarized by a CMP process until the top surface of the seed layer 36 is even (or substantially even) with the top layer of insulation pattern 32.

In accordance with an example embodiment of the present invention, a surface treatment may be further formed on a surface of the seed layer 36 using an aqueous hydrogen fluoride (HF) solution, so that a native oxide layer may be removed from a surface of an object including the seed layer 36, and a hydrogen passivation layer may be formed on the surface of the object.

Figure 3C:
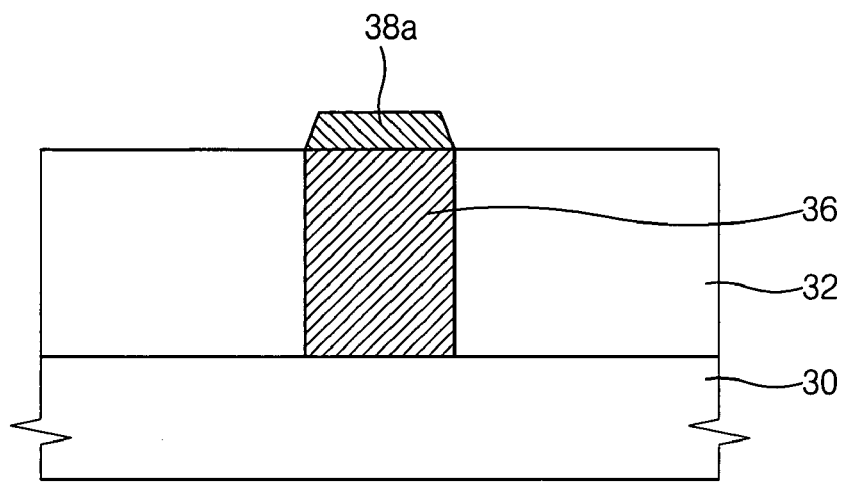
Figure 3D:
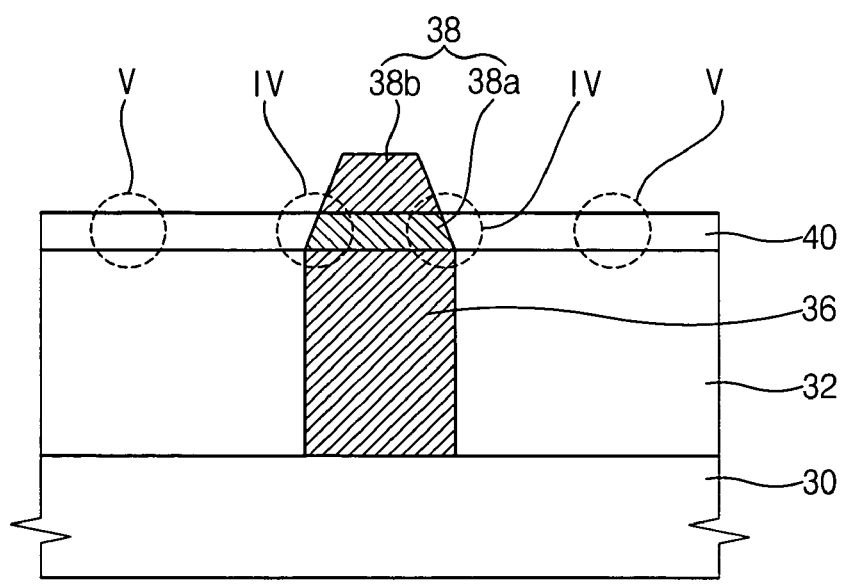

Referring to the example embodiments of FIGS. 3C and 3D of the present invention, a silicon source gas and a nitrogen gas may be supplied onto the object including the seed layer 36. The silicon source gas and the nitrogen may be provided in the same manner as described in Example Embodiment 1.

As described above in connection with an example embodiment of the present invention, the silicon source gas may be supplied onto the object including the seed layer 36, and a native oxide layer may be sufficiently prevented (or reduced or minimized) from being formed on the seed layer 36. Accordingly, an epitaxial layer 38 may be grown on the seed layer 36 and an amorphous silicon layer 40 may be formed on the insulation pattern 32 without (or substantially without) the native oxide layer forming on the seed layer 36.

The epitaxial layer 38 (e.g., layers 38a and 38b of FIG. 3D) and the amorphous silicon layer 40 may be formed by the same process as described above. As a result, the epitaxial layer 38 including a first epitaxial layer 38a and a second epitaxial layer 38b may be formed on the seed layer 36 without (or substantially without) the native oxide layer and the amorphous silicon layer 40 may be formed to a substantially uniform thickness on the insulation pattern 32 across both a first portion IV at which the seed layer 36 makes contact with the insulation pattern 32 and across a second portion V extending outwardly from the first portion IV on the insulation pattern 32 as depicted in FIG. 3D.

Figure 3E:
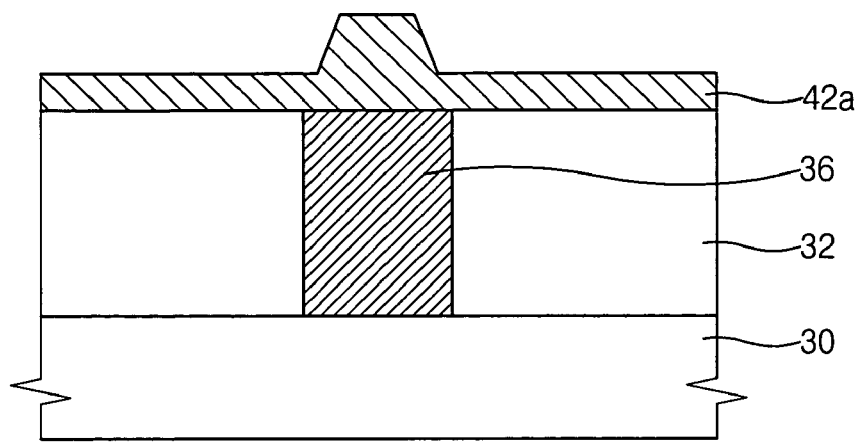

Referring to the example embodiment of FIG. 3E of the present invention, the amorphous silicon layer 40 may be transformed into a single-crystalline layer by the same process as described in connection with Example Embodiment 1, so that a preliminary second single-crystalline silicon layer 42a (as depicted in FIG. 3E) may be formed on the insulation pattern 32 from the epitaxial layer 38 (e.g., 38a and 38b depicted in FIG. 3D) and the amorphous silicon layer 40 (depicted in FIG. 3D).

Figure 3F:
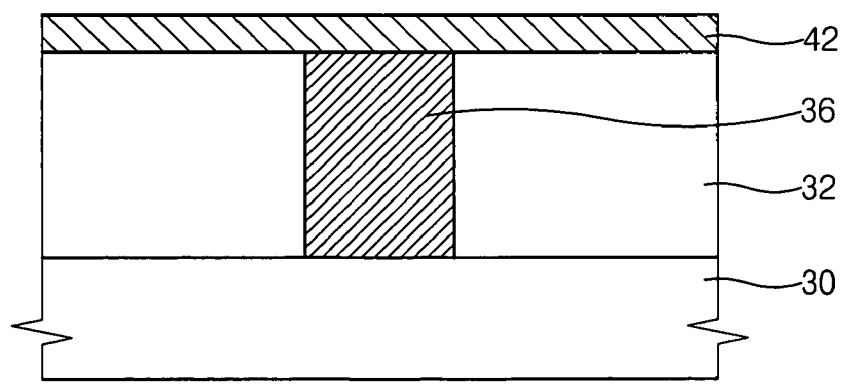

Referring to the example embodiment of FIG. 3F of the present invention, the preliminary second single-crystalline silicon layer 42a may be planarized by the same CMP process as described above, thereby forming a second single-crystalline silicon layer 42, the top surface of which is flat (or substantially flat).

According to an example embodiment of the present invention, the preliminary second single-crystalline silicon layer 42a may be transformed from the amorphous silicon layer 40 having a substantially uniform thickness across both the first portion IV and the second portion V, so that the second single-crystalline silicon layer 42 has no cut-off portion (as depicted in FIG. 3F) despite a CMP process being conducted on the preliminary second single-crystalline silicon layer 42a.

According to an example embodiment of the present invention, the second single-crystalline silicon layer 42 may have a flat (or substantially sufficiently flat) top surface, so that a stacked structure for a semiconductor device formed on the second single-crystalline silicon layer 42 may have improved electronic characteristics. For example, the second single-crystalline silicon layer 42 (as depicted in FIG. 3F) may be used as a channel layer for a semiconductor device.

Figure 5:
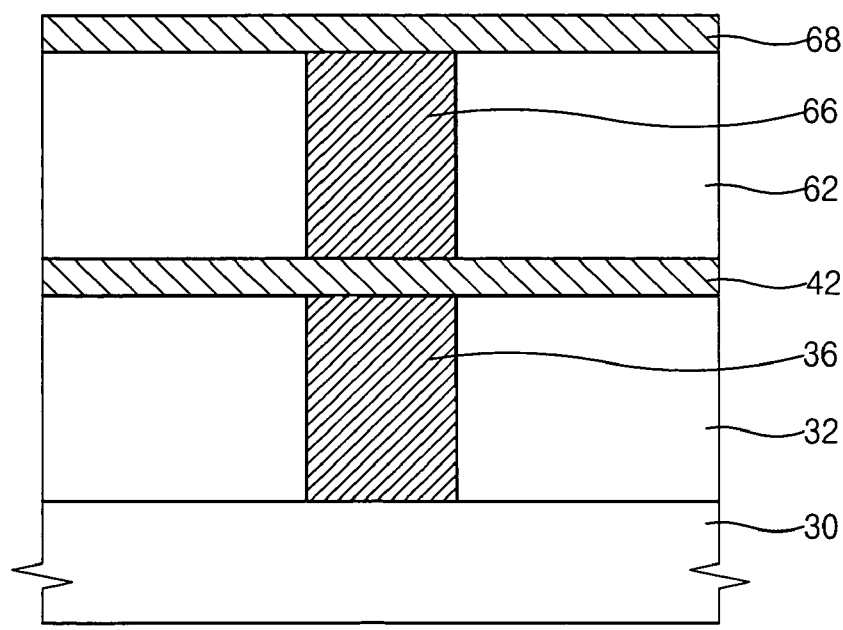
FIG. 5 is a cross sectional view illustrating an intermediate and/or a final structure of for a method of forming a thin layer according to an example embodiment of the present invention.

Referring to the example embodiment of FIG. 5 of the present invention, this figure depicts a cross sectional view illustrating processing stages of a method of forming a thin layer. In accordance with FIGS. 3A-3F, the insulation pattern 32 is referred to as a first insulation pattern and the seed layer 36 is referred to as a first seed layer.

Referring to the example embodiment of FIG. 5 of the present invention, an active region may be formed on the second single-crystalline silicon layer 42. Furthermore, a channel region for a semiconductor device may be formed on the active region according to an example embodiment of the present invention. Then, a semiconductor structure such as a gate electrode, metal wiring or a logic device may be formed on the second single-crystalline silicon layer 42.

According to the example embodiment of FIG. 5 of the present invention, a second insulation pattern 62, which is substantially identical to the first insulation pattern 32, may be formed on the second single-crystalline silicon layer 42 by the same process as described above. Then, a second seed layer 66 and a third single-crystalline silicon layer 68, which are substantially identical to the first seed layer 36 and the second single-crystalline silicon layer 42, respectively, may be formed by the same process as described above.

In accordance with an example embodiment of the present invention, by the same (or similar) process, up to and including an $n^{th}$ insulation pattern, up to and including an $n^{th}$ seed layer, and up to and including an $(n+1)^{th}$ insulation pattern (wherein, n is a natural number no less than three) may be provided (e.g., stacked) on the third single-crystalline silicon layer 68.

According to an example embodiment of the present invention, a single-crystalline silicon layer that may have a more defect-free crystal structure with a more uniform thickness sufficient to form a stacked structure (e.g., for a semiconductor device based on the single-crystalline silicon layer) having improved electronic characteristics may be formed.

A conventional single-crystalline silicon thin layer and a single-crystalline silicon thin layer according to an example embodiment of the present invention were compared evaluated for verifying any improvement of the single crystalline layer with respect to the degree of thinning defect(s) present.

Figure 6:
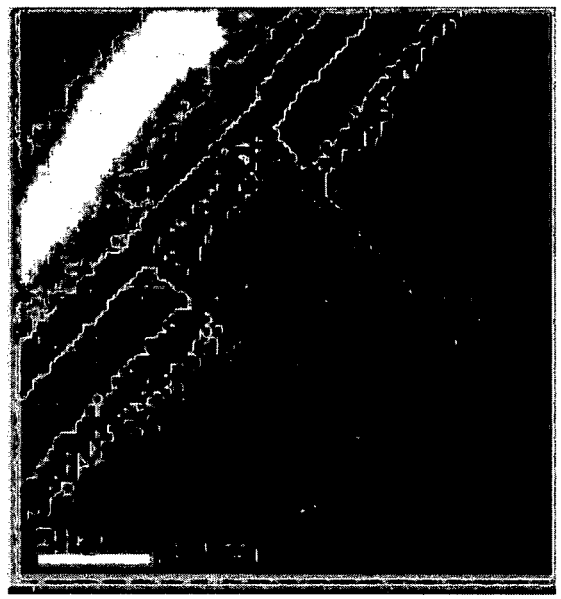
FIGS. 6 and 7 are pictures illustrating a cross sectional surface of a single-crystalline silicon thin layer made according to example embodiments of the present invention.
Figure 7:
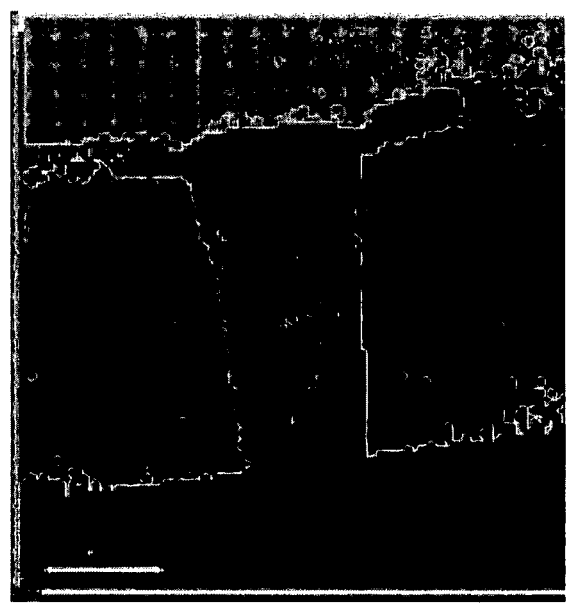
Figure 8:
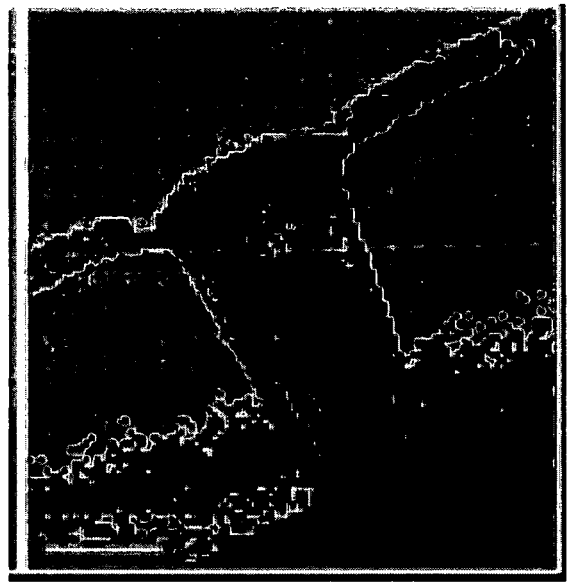
FIGS. 8 and 9 are pictures illustrating a cross sectional surface of a conventionally made single-crystalline silicon thin layer.
Figure 9:
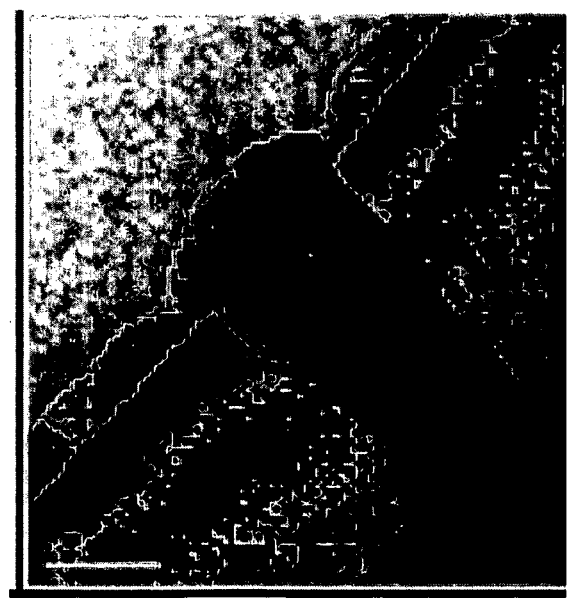

The example embodiment of FIGS. 6 and 7 of the present invention are pictures illustrating a cross sectional surface of a single-crystalline silicon thin layer made in accordance with an example embodiment of the present invention. FIGS. 8 and 9 are pictures illustrating a cross sectional surface of a single-crystalline silicon thin layer made according to a conventional process.

In particular, an epitaxial layer was grown on a seed layer, which was a single-crystalline silicon layer, and an amorphous silicon layer was formed on an insulation pattern at a temperature of about 485° C. by the same process as described above, thereby, forming a first specimen, a cross-section of which is depicted in FIG. 6. Also, an epitaxial layer was grown on a seed layer, which was a single-crystalline silicon layer, and an amorphous silicon layer was formed on an insulation pattern at a temperature of about 505° C. by the same process as described above, thereby, forming a second specimen, a cross-section of which is depicted in FIG. 7.

An epitaxial layer was grown on a seed layer, which was a single-crystalline silicon layer, and an amorphous silicon layer was formed on an insulation pattern at a temperature of about 525° C. by a conventional process, thereby, forming a third specimen, a cross-section of which is depicted in FIG. 8. An epitaxial layer was grown on a seed layer, which was a single-crystalline silicon layer, and an amorphous silicon layer was formed on an insulation pattern at a temperature of about 545° C. by a conventional process, thereby forming a fourth specimen, a cross-section of which is depicted in FIG. 9.

The first, second, third and fourth specimens were evaluated by a transmission electron microscope (TEM). A TEM picture showing a cross-sectional surface of the first specimen is illustrated in FIG. 6, and a TEM picture showing a cross-sectional surface of the second specimen is illustrated in FIG. 7. A TEM picture showing a cross-sectional surface of the third specimen is illustrated in FIG. 8, and a TEM picture showing a cross-sectional surface of the fourth specimen is illustrated in FIG. 9.

Referring to the example embodiments of FIGS. 6 and 7 of the present invention, the thinning defect was hardly noticeable on the amorphous silicon layer at a boundary portion between the seed layer and the insulation pattern. As for the first specimen, the thickness of the amorphous silicon layer at the boundary portion was about 71% of the greatest thickness of the amorphous silicon layer, and as for the second specimen, the thickness of the amorphous silicon layer at the boundary portion was about 55% of the greatest thickness of the amorphous silicon layer.

In contrast, referring to FIGS. 8 and 9, the thinning defect was quite noticeable on the amorphous silicon layer at a boundary portion between the seed layer and the insulation pattern. As for the third specimen, the thickness of the amorphous silicon layer at the boundary portion was about 32% of the greatest thickness of the amorphous silicon layer, and as for the fourth specimen, the thickness of the amorphous silicon layer at the boundary portion was about 28% of the greatest thickness of the amorphous silicon layer.

Thus, according to example embodiments of the present invention, the thinning defect of the amorphous silicon layer may be sufficiently prevented (or reduced or minimized) at a boundary portion between an insulation pattern and a single-crystalline silicon layer, so that the single-crystalline silicon layer formed from the amorphous silicon layer exhibits a lesser/lower extent of a thinning as illustrated in FIGS. 6 and 7. As a result, a stacked structure for a semiconductor device based on the single-crystalline silicon layer made according to example embodiments of the present invention are expected to have improved electronic characteristics.

Although the example embodiments of the present invention have been disclosed for illustrative purposes, those skilled in the art will appreciate that various modifications, additions and substitutions are possible, without departing from the spirit and scope of the invention as disclosed in the accompanying claims.

What is claimed is:

1. A method of forming a thin layer, comprising:
   providing a first single-crystalline silicon layer partially exposed through an opening in an insulation pattern; and
   forming an epitaxial layer on the first single-crystalline silicon layer and forming an amorphous silicon layer on the insulation pattern, the amorphous silicon layer having a first portion adjacent the epitaxial layer and a second portion spaced apart from the first portion;
   wherein the amorphous silicon layer is formed on the insulation pattern at the same rate at the first portion and at a second portion.

2. The method of claim 1, wherein the first single-crystalline silicon layer comprises a silicon substrate or a silicon-on-insulator (SOI) substrate.

3. The method of claim 1, wherein the first single-crystalline silicon layer includes an epitaxial layer formed by a selective epitaxial growth (SEG) process using single-crystalline silicon as a seed.

4. The method of claim 1, wherein the insulation pattern comprises an oxide.

5. The method of claim 1, wherein forming the epitaxial layer and forming the amorphous silicon layer includes supplying a silicon source gas.

6. The method of claim 5, wherein the silicon source gas is selected from the group consisting of a $Si_xH_y$ (wherein, x and y are positive numbers) gas, a $Si_xH_yCl_z$ (wherein, x, y and z are positive numbers) and a $Si_xCl_y$ gas (wherein, x and y are positive numbers).

7. The method of claim 1, wherein forming the epitaxial layer on the first single-crystalline silicon layer and forming the amorphous silicon layer on the insulation pattern is conducted at a temperature in a range from about 380° C. to about 510° C.

8. The method of claim 6, wherein forming the epitaxial layer on the first single-crystalline silicon layer and forming the amorphous silicon layer on the insulation pattern is conducted at a silicon source gas pressure in a range from about 0.2 torr to about 0.6 torr.

9. The method of claim 1, wherein forming the epitaxial layer on the first single-crystalline silicon layer and forming the amorphous silicon layer on the insulation pattern further comprises:
   growing a first epitaxial layer on the first single-crystalline silicon layer under processing conditions for subsequently forming of the amorphous silicon layer on the insulation pattern; and
   growing a second epitaxial layer on the first epitaxial layer and forming the amorphous silicon layer on the insulation pattern.

10. The method of claim 9, wherein growing the first epitaxial layer includes supplying a silicon source gas at a first flow rate while increasing a temperature of the silicon source gas in a range from about 380° C. to about 410° C. to a range from about 480° C. to about 510° C., and wherein growing the second epitaxial layer and forming the amorphous silicon layer comprises supplying the silicon source gas at a second flow rate while maintaining the temperature of the silicon source gas in a range from about 480° C. to about 510° C., the second flow rate being from about two to about four times as much as the first flow rate.

11. The method of claim 10, further comprising decreasing the temperature of the silicon source gas from a first range from about 480° C. to about 510° C. to a second range from about 380° C. to about 410° C.

12. The method of claim 1, further comprising forming a second single-crystalline silicon layer from the epitaxial layer and from the amorphous silicon layer by transforming the amorphous silicon layer into a single-crystal structure.

13. The method of claim 12, wherein forming the second single-crystalline silicon layer includes a solid epitaxial process including a heat treatment.

14. The method of claim 13, wherein the heat treatment is conducted at a temperature in a range from about 570° C. to about 650° C.

15. The method of claim 5, wherein nitrogen gas is supplied simultaneously with the silicon source gas.

16. The method of claim 15, wherein a flow rate of the nitrogen gas is no more than a flow rate of the silicon source gas.

17. A method of forming a thin layer, comprising:
providing a first single-crystalline silicon layer partially exposed through an opening in a first insulation pattern;
forming a first seed layer on the exposed surface of the first single-crystalline silicon layer through the opening, the first seed layer comprising single-crystalline silicon;
forming an epitaxial layer on the first seed layer and forming an amorphous silicon layer on the insulation pattern, the amorphous silicon layer having a first portion adjacent the first seed layer and a second portion spaced apart from the first portion, wherein the amorphous silicon layer is formed on the insulation pattern at the same rate at the first portion and at a second portion; and
forming a second single-crystalline silicon layer from the epitaxial layer and from the amorphous silicon layer by transforming the amorphous silicon layer into a single-crystal structure.

18. The method of claim 17, wherein forming the epitaxial layer and forming the amorphous silicon layer includes supplying a silicon source gas.

19. The method of claim 17, wherein the first seed layer is formed by a selective epitaxial growth (SEG) process using the first single-crystalline silicon layer as a seed.

20. The method of claim 17, further comprising removing the first seed layer until a top surface of the first insulation pattern is exposed provided that the first seed layer is formed to a thickness greater than a thickness of the first insulation pattern.

21. The method of claim 17, further comprising planarizing the second single-crystalline silicon layer, so that a top surface of the second single-crystalline silicon layer is flat.

22. The method of claim 17, further comprising stacking from a second up to an $n^{th}$ insulation pattern identical to the first insulation pattern, stacking from a second up to an $n^{th}$ seed layer identical to the first seed layer, and stacking from a third up to an $(n+1)^{th}$ insulation pattern (wherein, n is a natural number no less than three) on the second single-crystalline silicon layer.

* * * * *